United States Patent [19]

Hooper et al.

[11] Patent Number: 5,212,650

[45] Date of Patent: May 18, 1993

[54] PROCEDURE AND DATA STRUCTURE FOR SYNTHESIS AND TRANSFORMATION OF LOGIC CIRCUIT DESIGNS

[75] Inventors: Donald F. Hooper, Northboro; Snehamay Kundu, Marlboro, both of Mass.

[73] Assignee: Digital Equipment Corporation, Maynard, Mass.

[21] Appl. No.: 393,107

[22] Filed: Aug. 3, 1989

Related U.S. Application Data

[63] Continuation of Ser. No. 907,303, Sep. 12, 1986, abandoned.

[51] Int. Cl.$^5$ ............................................. G06F 15/60
[52] U.S. Cl. .................................. 364/489; 364/488; 395/921
[58] Field of Search ............... 364/488, 489, 490, 491; 395/51, 54, 75, 921

[56] References Cited

U.S. PATENT DOCUMENTS

| | | | |
|---|---|---|---|
| T935,003 | 6/1975 | Linville et al. | 364/490 |
| 4,377,849 | 3/1983 | Finger et al. | 364/491 |
| 4,386,403 | 5/1983 | Hsieh et al. | 364/300 |
| 4,510,616 | 4/1985 | Lougheed et al. | 364/490 |
| 4,554,631 | 11/1985 | Reddington | 364/300 |
| 4,584,653 | 4/1986 | Chih et al. | 364/488 |
| 4,613,940 | 9/1986 | Shenton et al. | 364/488 |
| 4,656,603 | 4/1987 | Dunn | 364/488 |
| 4,700,317 | 10/1987 | Watanabe et al. | 364/488 |
| 4,703,435 | 10/1987 | Darringer et al. | 364/488 |
| 4,922,432 | 5/1990 | Kobayashi et al. | 364/488 |
| 4,937,755 | 6/1990 | Yokota et al. | 364/488 |

FOREIGN PATENT DOCUMENTS

| | | | |
|---|---|---|---|
| 0168650 | 1/1986 | European Pat. Off. | 364/489 |
| 1445914 | 8/1976 | United Kingdom | 364/490 |

OTHER PUBLICATIONS

C. L. Forgy, "OPS5 User's Manual," Carnegie-Mellon University (Jul., 1981).

H. Brown et al., "Palladio: An Exploratory Environment for Circuit Design," Computer, vol. 16, No. 12, pp. 41–56 (Dec. 1983).

Saito et al., "A CAD System for Logic Design Based on Frames and Demons," *Fujitsu Scientific and Technical Journal*, vol. 18, No. 3, pp. 437–451 (Sep., 1982).

Darringer et al., "Logic Synthesis Through Local Transformations," IBM Res. Develop., vol. 25, No. 4, pp. 272–280 (Jul., 1991).

(List continued on next page.)

*Primary Examiner*—Vincent N. Trans
*Attorney, Agent, or Firm*—Denis G. Maloney; Ronald E. Myrick; Barry N. Young

[57] ABSTRACT

A procedure is described for the synthesis and transformation of a logic circuit design, provided by the designers, into a database capable of being used to fabricate the actual circuit. The procedure involves the use of model instances which represent the use of circuit components. The original model instances can be associated with groups of rules that determine resulting configurations of generally different model instances or groups of model instances. The rules are tested and, in the presence of a 'true' result, a new model instance (or model instances) can replace one or more original model instances in the data base. The rules associated with a model type (or definition) are rules derived by a design model engineer and can include coupled model instances. The rules can be associated with model definitions, as well as model instances. The data structures associated with each model instance indicate the model interface as well as the model interface port and permit a path to followed in the circuit in either the forward or the reverse signal direction. The model instances reside within model definitions which reside with design data in hierarchical form. The rules controlling the synthesis and transformation of the circuit are contained in a separate hierarchy of data structures or knowledge structures to which reference can be made by design data structures.

33 Claims, 5 Drawing Sheets

OTHER PUBLICATIONS

"Artificial Intelligence in Computer Aided Design" by Shi Jiaoying et al., Computers in industry, Elseivier Science Publishers B.V. (North-Holland), 1987, pp. 277-282.

"Diverse design tools break into logic-synthesis arena", Computer Design, Oct. 15, 1987, pp. 20-21.

"Incremented Logic Synthesis Through Gate Logic Structure Identification" by T. Shinsha et al., 23rd Design Automation Conf., IEEE 1986, pp. 391-397.

Randy H. Katz, 'Managing the Chip Design Database', IEEE Computer, vol. 16, No. 12, Dec. 1983, pp. 26-35.

"Quality of Designs from an automatic Logic generation (ALERT)", Friedman et al., 7th DA Conference 1970, pp. 71-89.

"LORES-Logic Reorganization System", Nakamura et al., 15th DA Conference 1978, pp. 250-260.

"A New Look at Logic Synthesis", Darringer et al., 17th DA Conference 1980, pp. 543-549.

"Methods Used in an Automatic Logic Design Generator (ALERT)", Friedman et al., IEEE-Computer, vol. C-18, No. 7, Jul. 1969, pp. 593-610.

D. L. Dietmeyer, "Logic Design of Digital Systems", Allynt Bacon, Boston, 1978, pp. 156-238.

Daniel et al., "CAD Systems for IC Design", IEEE, Computer-Aided Design of Integrated Circuits and Systems, vol. CAD-1, No. 1, Jan. 1982, pp. 2-11.

Trimberger, "Automating Chip Layout", IEEE, Spectrum, vol. 19, No. 6, Jun. 1982, pp. 38-45.

Franco et al., "The Cell Design System", IEEE, 18th Design Automation Conference, paper 12.4, 1981, pp. 240-247.

Kessler et al., "Standard Cell VLSI Design: A Tutorial", IEEE Circuit and Devices Magazine, Jan. 1985, pp. 17-34.

PROCEDURE AND DATA STRUCTURE FOR SYNTHESIS AND TRANSFORMATION OF LOGIC CIRCUIT DESIGNS

This application is a continuation of application Ser. No. 06/907,303, filed Sep. 12, 1986 now abandoned.

RELATED PUBLICATIONS

The following publications and U.S. Patent Applications are related documents to the instant Application:

Managing the Chip Design Database, by Randy H. Katz, IEEE Computer, Vol. 16, No. 12, December 1983, pages 26 through 35.

Common LISP: The Language, by Guy L. Steele Jr, 1984, The Digital Press, Maynard, Mass., U.S.A.

Rule Structure In a Procedure for Synthesis of Logic Circuit Designs, invented by Donald F. Hooper et al., assigned to the same assignee named herein, having U.S. Ser. No. 907,512, filed Sep. 12, 1986.

Data Base Access Mechanism for Rules by a Synthesis Procedure for Logic Circuit Design, invented by Donald F. Hooper, assigned to the same assignee named herein, having Ser. No. 907,515, filed Sep. 12, 1986.

Rule Structure for Insertion of New Elements in a Circuit Design Synthesis Procedure, invented by Donald F. Hooper et al., assigned to the same assignee named herein, having Ser. No. 907,513, filed Sep. 12, 1986.

Bitwise Implementation Mechanism for a Circuit Design Synthesis Procedure, invented by Donald Hooper et al., assigned to the assignee named herein, having Ser. No. 907,516, filed Sep. 12, 1986.

BACKGROUND OF THE INVENTION

1. Field of the Invention

This invention relates generally to the design of data processing systems and similar structures, and more particularly to an automated technique for the design of a logic structure in a manner similar to the technique used by a design engineer.

2. Description of the Related Art

The design of digital logic circuits may be considered as a map of nodes and arcs, wherein the nodes are functional in nature and the arcs are connective in nature. For example, the functionality of a node may be that of an adder element, the adder element providing output signal in response to input signals. The adder element may be technology independent which, in the present context, means that the adder element has no physical characteristics associated therewith and therefore does not define a digital device. The technology independent adder element is functionally correct and has attributes, such as a shape, for use in drawings, simulation behavior, equivalent gate count, etc. If a digital device, with a defined technology, were available that exactly matched the behavior and the interface characteristics of the adder element, then the digital device could be substituted for the technology independent adder in the design of the circuit. This technique is used in the automated design of digital logic circuits of the prior art where the transformation from technology independent to technology dependent design is accomplished by the substitution of previously designed elements defined by a predetermined technology.

Figure 1:
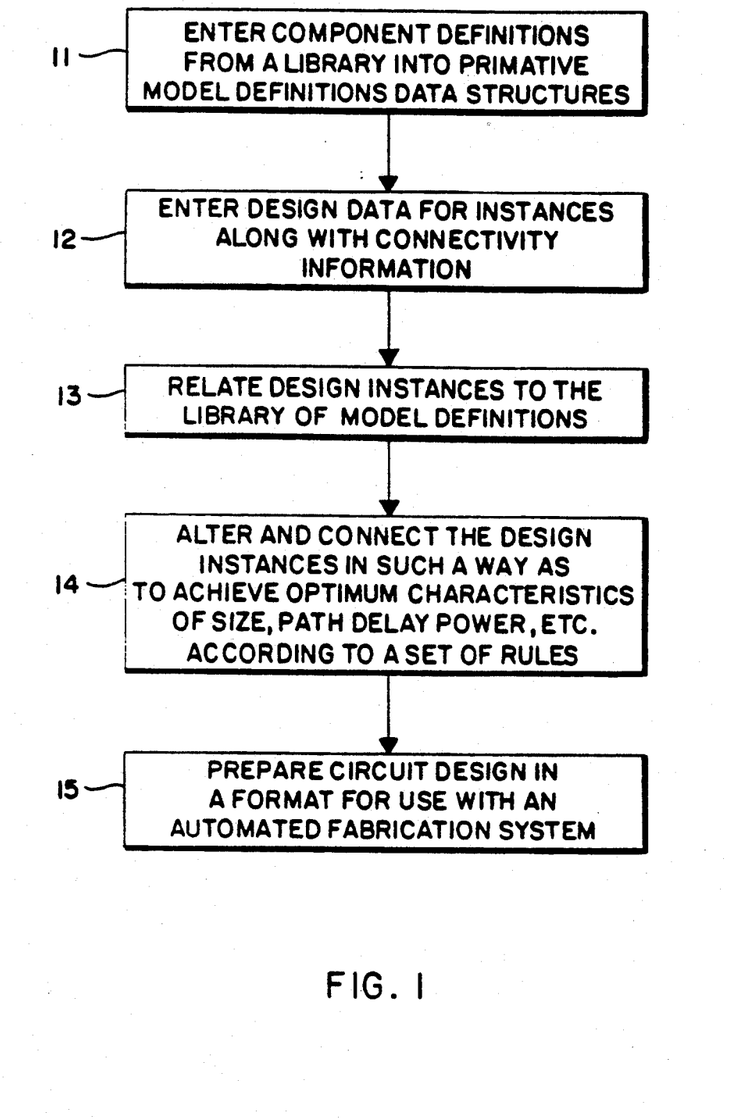
FIG. 1 is a flow diagram of the process for automatic synthesis of logic circuits according to the prior art.

Referring next to FIG. 1, the procedure for synthesizing a logic circuit design according to the prior art is shown. Model definition data structures from a library of component definitions are entered into the data structures associated with the synthesis data base in step 11. In step 12, the information related to the instances of the circuit design, including the connectivity information, is entered in the data base. The instances of the circuit design are generally in a behavioral or functional form when entered in the synthesis data base. The synthesis procedure relates the instances of the circuit design to the model instances in step 13. In step 14, a set of rules for the synthesis procedure is applied to each of the model instances and the model instances are altered and connected in such a way as to maximize certain parameters such as size, path delay, power, etc. In step 15, the resulting circuit design is placed in a format that can control the automated fabrication of the circuit.

It will be clear that the procedure for synthesizing a circuit described in relation to FIG. 1 is severely limited. If a circuit designer were synthesizing the same functionally described circuit, a functional component might suggest a plurality of model instances. Some of the suggested model instances would be more suitable than others. In addition, upon application of rules to the design process, the circuit designer would not exercise all possible rules, but would use only the applicable rules. A circuit designer would typically transform the functional components into the most elemental model instance implementations and then attempt, by an iterative process, for example, to converge on an optimum design. The optimum design goal is typically a combination of physical component size along with physical data transmission time through the entire circuit. In addition, the circuit designer would investigate the neighbors of the each model instance to determine if additional improvement in the circuit design can be achieved by combining coupled model instances. The circuit designer would also investigate signal paths whether in the direction of the signal flow or in the opposite direction from the signal flow.

A need, therefore, has been felt for a data base structure and an accompanying synthesis procedure that achieves additional flexibility and performance by utilizing techniques more closely mimicking the techniques of a circuit design engineer.

FEATURES OF THE INVENTION

It is an object of the present invention to provide an improved procedure for the design of digital logic circuits.

It is a feature of the present invention to provide two hierarchical information structures, a first hierarchical information structure for logic synthesis rules and a second hierarchical structure for logic design data.

SUMMARY OF THE INVENTION

The aforementioned and other features are obtained, according to the present invention, by a synthesis procedure that applies a set of rules to each model instance of a circuit design, the applied rules being: a) rules related only to the particular model instance, b) rules related to the LIBRARY definition of that model instance, or c) global design rules. As a result of the application of the rules, one or more alternative model instances can be available to replace the current model instance (and possibly other physically associated model instances). In the event that more than one replacement model instance is available, a mechanism is provided for the selection of the replacement model instance. Because model instances of the circuit design resulting from the application of the rules have been changed, the rules must be reapplied to the new model instances. This process is repeated until the circuit design is stabilized, i.e., until no rules return a 'true' value when tested. The structure of the files is implemented to support the synthesis procedure of the present invention. The data relating to the design of the circuits is placed in one hierarchy while the data relating to rules is placed in a separate hierarchy. The design data includes pointers relating design data to rule data. In addition, the design data relating to model instances includes explicit interface and interface port information as well as file constructs that permit a path through the circuit to be followed in any signal direction.

These and other features of the present invention will be understood upon reading of the following description along with the drawings.

DESCRIPTION OF THE PREFERRED EMBODIMENT

1. Detailed Description of the Figures

FIG. 1 has been previously described with respect to the related art.

Figure 2:
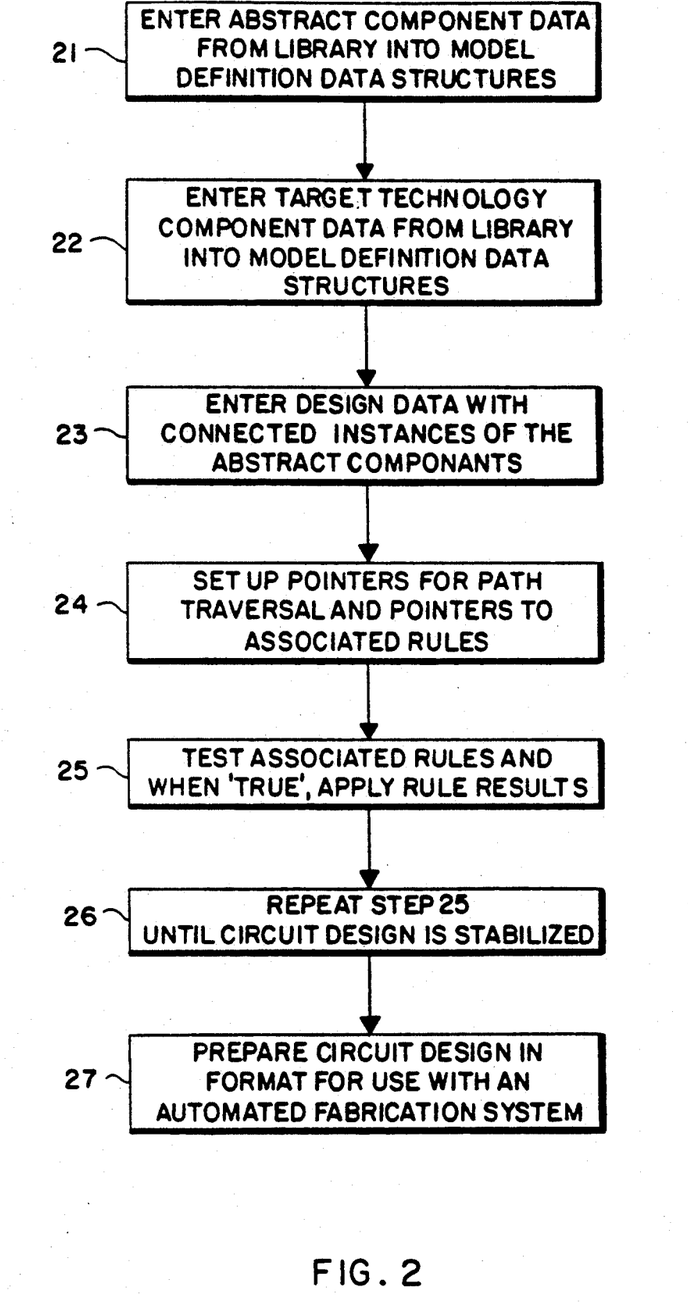
FIG. 2 is a flow diagram of the process for automatic synthesis of logic circuits according to the present invention.

Referring next to FIG. 2, the synthesis procedure of the present invention is shown. In step 21, abstract component data from a library of such data is entered into model definition data structures of the synthesis procedure. In step 22, component data relating to the target technology is entered into model definition data from the LIBRARY structures of the synthesis procedure. The circuit design data with the connected instances described in terms of abstract components is entered into the synthesis procedure in step 23. In step 24, the synthesis procedure provides two sets of pointers. The first set of pointers permits the synthesis procedure to follow any arbitrary path through the design circuit. The second set of pointers couples rules with associated data base structures. In step 25, the associated rules are tested for each model instance and when the test provides a 'true' result, the consequences of the rule is implemented. In the preferred embodiment, each rule has an antecedent portion and a consequence portion. The antecedent portion includes a test algorithm, and the consequence portion provides the information required to implement a result of the test. Because the rules are applied to model instances in a sequential manner, and because in the preferred embodiment the test procedures can involve neighboring instances that were are changed as a result of a test applied to that instance, the process is repeated until the circuit design has stabilized, as shown in step 26. In step 27, the final version of the circuit design is placed in a format suitable for use in an automated circuit fabrication system.

Figure 3:
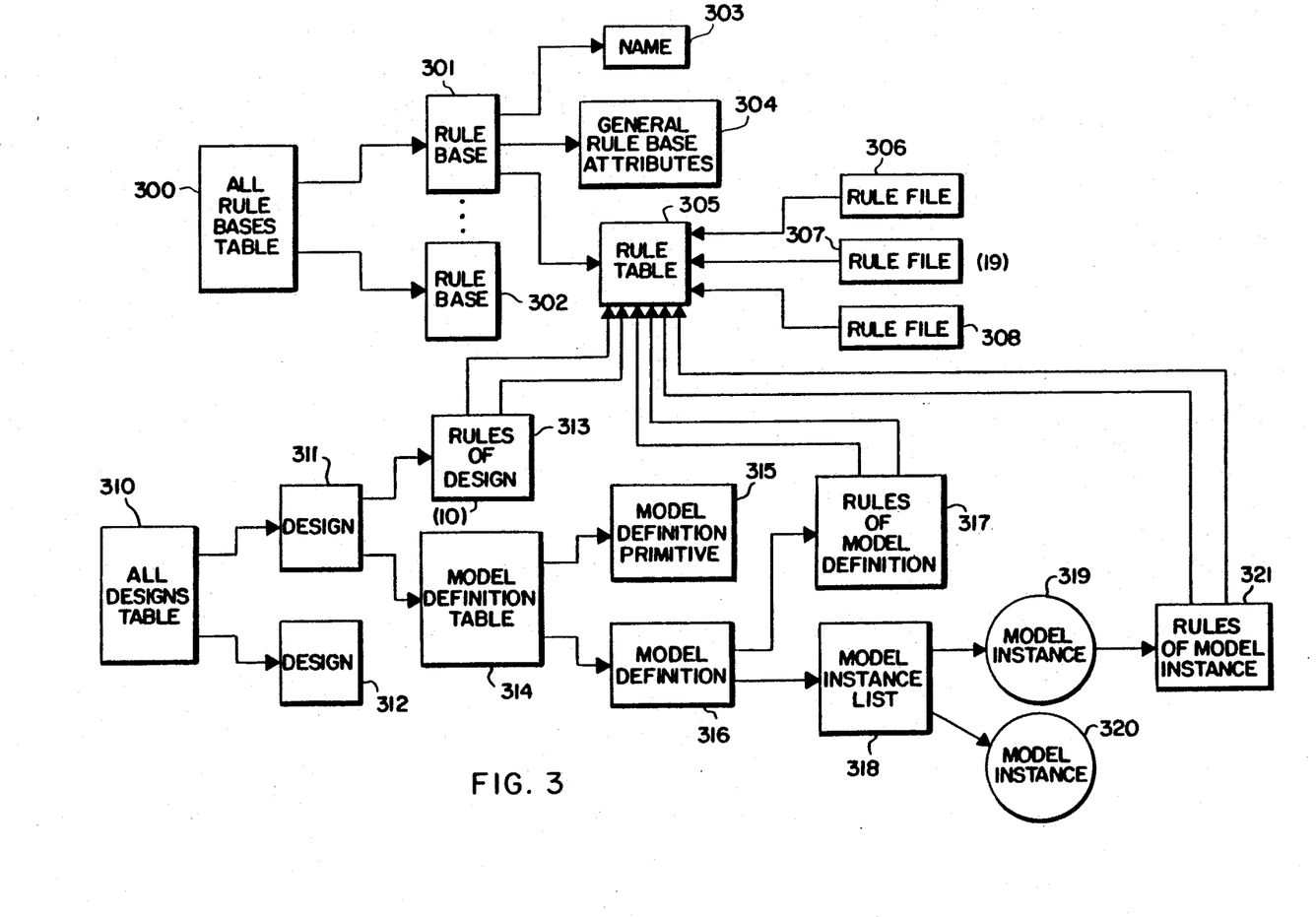
FIG. 3 is an overall diagram of the architecture for data structures of logic design and logic synthesis rules.

Referring now to FIG. 3, the architectural organization for the storage of the logic synthesis rules and the logic design rules are shown. Two storage hierarchies are available, one representing rule information and the second representing digital design information. These information hierarchies interact when pointers are established, relating the design objects to specific groups of rules. A rule file 306 through 308 is a collection of rules arbitrarily organized by the creator of the file. Several rule files can be transferred to a rule table 305. The rule table 305 is a lookup table that is indexed by the name of the rules stored therein. The rule table 305 is an attribute of a rule base 301 that has, in addition to the rules stored in rule table 305, a name 303 and other attributes 304 of the rule base. Any number of rule bases 301 through 302 are contained in the table of all rule bases 300. The all rule bases table 300 is a lookup table indexed by the name of the rule base. The all rule base table 300 is the top of the rule information hierarchy. The logic design data is partitioned into blocks, called model definitions 315 through 316. Any number of model definitions can be stored in the model definition table 314, a lookup table indexed by the model name. A model definition can contain a model instance list 318 that includes model instances 319 and 320 and that can include model instances of other model definitions. For any functional part type or structural body of a given name, only one model definition can exist. However, any functional part type or structural body can have zero or more model instances. The attributes of the model definition are common to all of the instances associated therewith and, therefore, need to be stored only with the model definition. The attributes of the model instances, such as timing parameters and simulation values, are unique to each model instance and consequently must be stored with the associated instance. Those model definitions with no model instances or for which a "LIBRARY" attribute is specified are considered primitive model definitions and are stored in table 315. The model definition table 314 is stored in a design table 311, the design table being capable of possessing other attributes. Any number of designs 311 through 312 can be contained in the all designs table 310.

Figure 4:
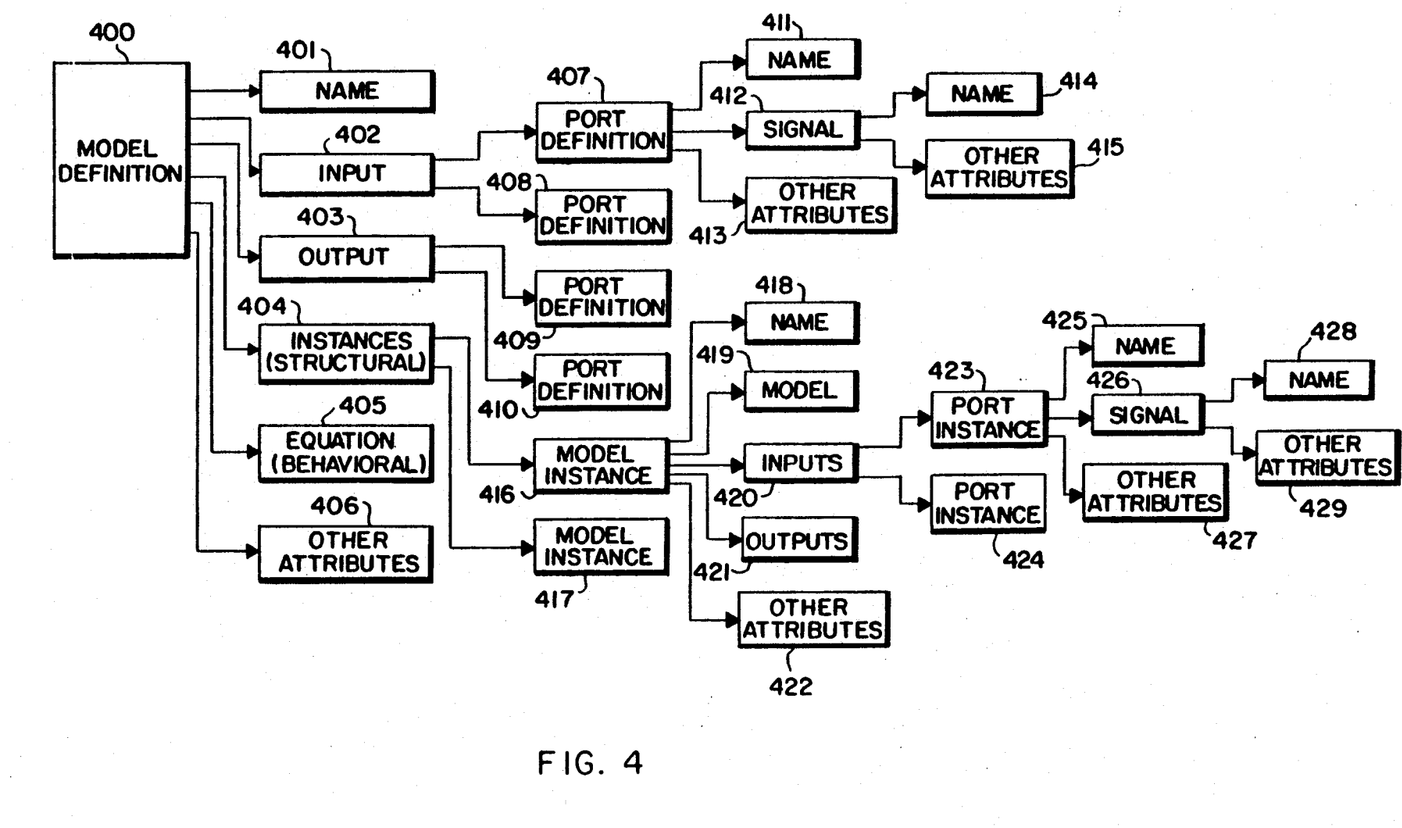
FIG. 4 is a detailed illustration of the hierarchical relationship of the objects of the design model as it is transferred between external software mechanisms and this system.

Referring to FIG. 4, the interface form of the model definition is shown. Each model definition has a name 401, an interface definition comprising input signals 402 and output signals 403 and other attributes 406. Each model definition can have a schematic, structural or data flow form, in which case the model definition would contain instances 404. Furthermore, a model definition can also have a functional form or a behavior form 405. The interface input signals are port definitions 407 and 408 and the interface output signals are also port definitions 409 and 410. Other types of interface signals such as bi-directional signals are possible. Port definitions have a name 411, a signal 412, and other attributes 413. The signal of a port definition has a name 414 and other attributes 415. The model instances 404 can have a plurality of individual model instances 416 and 417 included therein. Each model instance 416 and 417 has a unique name 418, a name of its model definition 419, input and output interface instances 420 and 421 and other attributes 422. The input and output instances 420 and 421 both consist of port instances 423 and 424, while each port instance has a name 425, signals 426 and other attributes 427. Each signal has a name 428 and other attributes 429.

Figure 5:
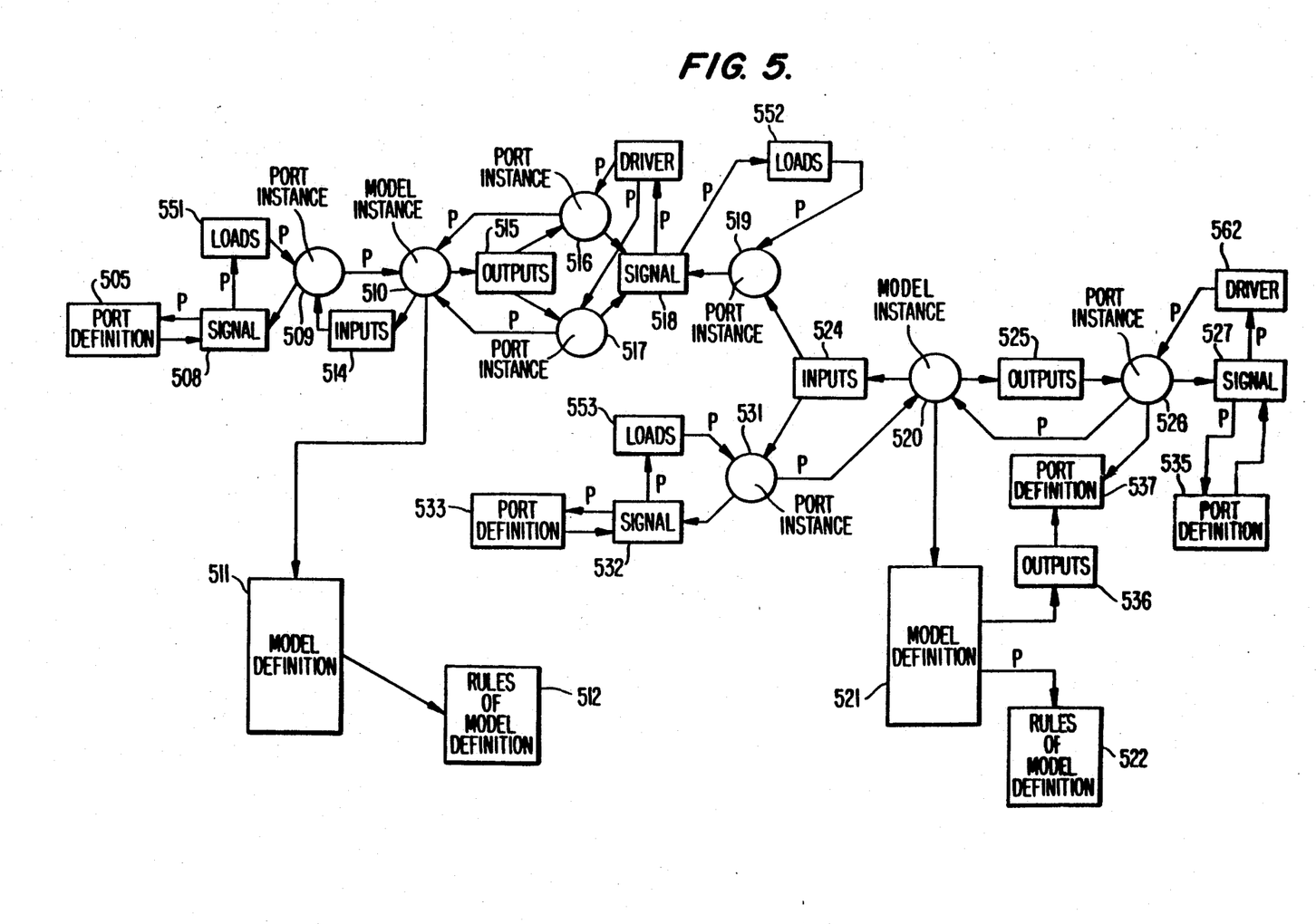
FIG. 5 is a detailed illustration of the objects of the FIG. 3 design model as it is stored within this system.

Referring next to FIG. 5, the connectivity of the components of the logic design tables is illustrated. The model instances and model definitions represent operational elements or functional blocks. The port instances and port definitions represent pins or interfaces of the operational elements or functional blocks. Signals represent the wires or connections between the pins or interfaces. In FIG. 5, two model instances 510 and 520 are shown. Model instances 510 and 520 have pointers associated therewith that point to model definitions 511 and 521, respectively. The model definitions 511 and 521 have pointers associated therewith that point to rules of model definitions 512 and 522 respectively. The pointer can be followed from the port definition 505 to the signal 508 to the loads (i.e., intermediate pointer locations) 551 to port instance 509 to model instance 510 to outputs 515 to port instances 516 and 517 to signal 518 to loads 552 to port instance 519 to model instance 520 to outputs 525 to port instance 526 to signal 527 to port definition 535. Moreover, according to the present invention, the pointers permit the design to be followed from the final output definition 535 to the initial port definition 505 in the following manner: from port definition 535 to signal 527 to drivers 562 to port instance 526 to model instance 520 to inputs 524 to port instance 531 to signal 532 to port definition 533. All port instances 526 point to the port definitions 537 which are defined in the model definition 521 of the associated model instance 520.

2. Operation of the Preferred Embodiment

The synthesis procedure of the present invention involves several features not found in synthesis procedures of the related art. The model instance files are constructed in such a manner that the rules applied to the model instance during the synthesis procedure relate only to the particular model instance or to the definition of that model instance. A small subset of rules remain which relate to the design as a whole. In addition, the set of rules related to the model instance can involve a plurality of possible replacement model instances. Furthermore, the files related to the model instance and circuit design to be synthesized permit the rules to follow data structure and signal paths through the circuit design in any direction. This capability can be important, for example, in following critical paths through the circuit. Finally, the synthesis procedure can involve the replacement of one or more model instances with one or more model instances. Such a replacement can result in a requirement for further synthesis activity. The synthesis procedure of the present invention is adapted for an iterative process.

Referring once again to FIG. 3, the system is initialized by creating the rules bases and the primitive model definitions. The pointers 'P' (cf. FIG. 3 and FIG. 5) are then installed through a "pointification" process. Rules may identify a relationship of a model definition by naming the model definition. Rules which do not name a model definition, if not associated with a model instance, are global design rules. The collection of rules for each model definition 317 (FIG. 3) are found in the rule table of each rule base. Pointers are established to point to the collection of rules and to the rule table 305. The rules of model definitions are organized into subgroups indexed by rule base names. When a rule does not identify a relationship to an object, a pointer pointing to the rule is placed in the rules of current design.

After the rule bases and the model definitions have been entered, the entry form of the logic design map is entered into the model definition table 314. The entry includes the interface specification, the model instances and their connectivity, and other attributes. Any model instance may also refer to rules of model instances 321 to be applied only to that model instance. The related rule is found in the rule base 305 and a pointer to the rule is established. The two hierarchies are interrelated by pointers from the logic design map to the rules of design, rules of model definitions and rules of model instances.

A model definition is entered by an external software mechanism and inserted into the internal data structures. The model definition is placed in the models definition table of the current design (i.e., Table 314 in FIG. 3). Pointers are added as shown in FIG. 5 and can be utilized as described above in conjunction with FIG. 3. Data structures with the internal references described above provide a system of accessible logic elements on which the the logic synthesis rules can operate. The rules that embody design knowledge can number in the hundreds. A rule can have an antecedent activity and a consequent activity. Typically in rule-base driven software, the antecedent activity acts as a predicate to test the working data and should the predicate return a 'true' value, the consequent activity serves to change the working data. However, unlike previous rule-based software systems which store the working data in a non-hierarchical memory table, the data to be operated upon in the present invention is the hierarchical database itself. Also, unlike the previous rule-based design systems in which the entire rule set is scanned sequentially, in this system, the model instances are scanned in parallel and for each instance, only a small subset of rules associated with the type of model instance is scanned. As is characteristic of rule based systems, the consequences of several rules can return a 'true' verdict, and an arbitration rule mechanism used for conflict resolution, chooses the rule to be applied. In the present invention, the best set of rules for each model instance is chosen. Then, the set of chosen rules are tested and applied to their respective model instances. The priority is determined by a SIZEWIN field of the rules.

The foregoing description is included to illustrate the operation of the preferred embodiment and is not meant to limit the scope of the invention. The scope of the invention is to be limited only by the following claims. From the foregoing description, many variations will be apparent to those skilled in the art that would yet be encompassed by the spirit and scope of the invention.

What is claimed is:

1. A process for automatic design of a logic circuit by a data processing system which yields a data structure representing interconnected logic components, said data structure being stored in a data base in a memory of the data processing system, the process being performed by the data processing system and comprising the steps, performed by the data processing system, of:

inputting into locations of the data base in the memory, by the data processing system, data representing a plurality of logic components, the logic components corresponding to components of a logic circuit and belonging to different levels of a data hierarchy;

inputting, by the data processing system, a plurality of rules to the data-base, the rules belonging to different levels of a rule hierarchy;

establishing, by the data processing system, bidirectional pointers between the locations in the data base containing the data for the plurality of logic components, the pointers being determined according to the logic circuit, wherein the pointers allow the location containing data for any logic component in the data base to be accessed by following pointers from the location containing data for any other logic component in the data base; and altering, by the data processing system, a subset of the data for the logic components in the data base by application of one of the plurality of rules stored in the data base to one of the plurality of logic components, called a current logic component, the altering of the subset resulting in a formation in the data base in the memory of a new data structure representing a logic circuit including a plurality of interconnected logic components.

2. The process of claim 1, wherein the inputting step includes the step of inputting the plurality of logic components to the data base, the logic components representing the logic design to be synthesized and being connected with unidirectional pointers, and wherein the establishing step includes the step of changing a plurality of the unidirectional pointers into bidirectional pointers during a pointification process.

3. The process of claim 1, wherein the altering step further comprises the step of:

applying ones of a set of rules to the plurality of logic components in parallel, where each of the plurality of logic components is a current logic component for the rule applied to that logic component.

4. The process of claim 1, wherein the logic components include model instances defining specific instances of a component and model definitions defining functionality of the respective model instances, and wherein the establishing step includes the step of establishing a pointer from a model instance to a model definition defining functionality of the model instance.

5. The process of claim 4, wherein the establishing step of claim 4 includes the step of establishing a pointer from a model definition to an input component defining inputs for the model definition.

6. The process of claim 5, wherein the establishing step of claim 5 includes the step of establishing a pointer from an input component for a model definition to a port definition component defining an interface of the input component.

7. The process of claim 4, wherein the establishing step of claim 4 includes the step of establishing a pointer from a model definition to an output component defining outputs for the model definition.

8. The process of claim 7, wherein the establishing step of claim 7 includes the step of establishing a pointer from an output component for a model definition to a port definition component defining an interface of the output component.

9. The process of claim 4, wherein the inputting step of claim 4 includes inputting behavioral equations for a model definition.

10. The process of claim 4, wherein the establishing step of claim 4 includes the step of establishing a pointer from a model instance to an input component defining inputs for the model instance.

11. The process of claim 10, wherein the establishing step of claim 10 includes the steps of:

establishing a pointer from an input component for a model instance to a port instance component that defines an interface for the input component; and establishing a pointer from the port instance to the model instance.

12. The process of claim 11, wherein the establishing step of claim 11 includes the step of establishing a pointer from a port instance component to a signal component defining a wire between the port instance component and another component.

13. The process of claim 12, wherein the establishing step of claim 12 includes the steps of:

establishing a pointer from a signal component of a model instance to a loads component defining a load of the signal; and establishing a pointer from the loads component to the port instance component of the model instance.

14. The process of claim 11, wherein the establishing step of claim 11 includes the step of establishing a pointer from a port instance component to a port definition component functionally defining the interface of the input component of the model instance.

15. The process of claim 4, wherein the establishing step of claim 4 includes the step of establishing a pointer from a model instance to an output component defining outputs for the model instance.

16. The process of claim 15, wherein the establishing step of claim 15 includes the steps of:

establishing a pointer from an output component for a model instance to a port instance component that defines an interface of the output component; and establishing a pointer from the port instance to the model instance.

17. The process of claim 16, wherein the establishing step of claim 16 includes the step of establishing a pointer from a port instance component to a signal component defining a wire between the port instance component and another component.

18. The process of claim 17, wherein the establishing step of claim 17 includes the steps of:

establishing a pointer from a signal component of a model instance to a driver component defining a driver of the signal; and establishing a pointer from the driver component to the port instance component of the model instance.

19. The process of claim 16, wherein the establishing step of claim 16 includes the step of establishing a pointer from a port instance component to a port definition component functionally defining the interface of the output component of the model instance.

20. A process for automatic design of a logic circuit by a data processing system which yields a data structure representing interconnected logic components, said data structure being stored in a data base in a memory of the data processing system, the process being performed by the data processing system and comprising the steps, performed by the data processing system, of:

inputting into locations of the data base in the memory, by the data processing system, data representing a plurality of logic components, the logic components corresponding to components of a logic circuit and belonging to different levels of a data hierarchy;

inputting, by the data processing system, a plurality of rules to the data base, ones of the rules belonging to different levels of a rule hierarchy;

establishing, by the data processing system, pointers between a first subset of the rules having a first rule hierarchy level and ones of the plurality of logic components having a first data hierarchy level;

establishing, by the data processing system, pointers between a second subset of the rules having a second rule hierarchy level and subsets of the plurality of logic components having a second data hierarchy level;

altering, by the data processing system, a subset of the data for the plurality of logic components by application of one of the first subset of rules to a current logic component pointing to an applied rule, when at least one rule in the first subset of rules is applicable to the current logic component, the altering of the subset resulting in a formation in the data base in the memory of a new data structure representing a logic circuit including a plurality of interconnected logic components.

21. The process of claim 20, further including the step of:
altering a subset of the plurality of logic components by application of one of the second subset of rules to a current logic component pointing to the applied rule, when no rules in the first subset of rules are applicable to the current logic component.

22. The process of claim 21, wherein data of the first data hierarchy level are called model instances and data of the second data hierarchy level are called model definitions, wherein the second subset of rules are associated with a model definition, and wherein the altering step of claim 21 includes the step of altering a subset of the plurality of logic components by application of one of the second subset of rules to a current model instance whose model definition points to the applied rule, when no rules in the first subset of rules are applicable to the current model instance.

23. The process of claim 21, further including the steps of:
establishing pointers between a third subset of the rules and all of the logic components, wherein the third subset of rules is a subset of design rules for the entire data base; and
altering a subset of the plurality of logic components by application of one of the third subset of rules to a current logic component pointing to the applied rule, when no rules in the first or second subsets of rules are applicable to the current logic component.

24. The process of claim 21, wherein the plurality of logic components include model instances of the first data hierarchy level that define specific components, and model definitions of the second data hierarchy level that define functional components, wherein each model instance is a specific instance of a model definition,
wherein the step of establishing pointers between a first subset of the rules and ones of the plurality of logic components further includes the step of establishing pointers between the first subset of rules and ones of the plurality of model instances,
wherein the step of establishing pointers between a second subset of the set of rules and subsets of the plurality of logic components includes the step of establishing pointers between a second subset of the set of rules and ones of the model definitions,
wherein the step of altering a subset of the plurality of logic components by application of one of the first subset of rules to a current logic component, when at least one rule in the first subset of rules is applicable to the current logic component further includes the step of altering a subset of the plurality of model instances by application of one of the first subset of rules to a current model instance pointing to the applied rule, when at least one rule in the first subset of rules is applicable to the current model instance, and
wherein the step of altering a subset of the plurality of logic components by application of one of the second subset of rules to a current logic component, when no rules in the first subset of rules is applicable, further includes the step of altering a subset of the plurality of model instances by application of one of the second subset of rules to a current model instance associated with a model definition pointing to the applied rule, when no rules in the first subset of rules is applicable to the current model instance.

25. A data processing apparatus for automatic design of a logic circuit which yields a data structure representing interconnected logic components, said data structure being stored in a data base in a memory of the data processing system, the data processing apparatus comprising:
a memory;
means for inputting into locations of the data base in the memory data representing a plurality of logic components, the logic components corresponding to a logic design to be synthesized and belonging to different levels of a data hierarchy;
means for inputting a plurality of rules to the data base in the memory, ones of the rules belonging to different levels of a rule hierarchy;
means for establishing bidirectional pointers between the locations in the data base containing the data for the plurality of logic components, the pointers being determined according to the logic circuit to be synthesized, wherein the pointers allow the location containing data for any logic component in the data base in the memory to be accessed by following pointers from the location containing data for any other logic component in the data base in the memory; and
means for altering a subset of the data for the logic components in the data base in the memory by application of a rule stored in the data base in the memory to one of the plurality of logic components, called a current logic component, the altering of the subset resulting in a formation in the data base in the memory of a new data structure representing a logic circuit design including a plurality of interconnected logic components.

26. The apparatus of claim 25, wherein the means for inputting a plurality of logic components includes means for inputting the plurality of logic components to a data base, the logic components representing the logic design to be synthesized and being connected with unidirectional pointers, and
wherein the means for establishing includes means for changing a plurality of the unidirectional pointers into bidirectional pointers during a pointification process.

27. The apparatus of claim 25, wherein the means for altering further includes:
means for applying ones of a set of rules to the plurality of interconnected logic components in parallel, where each of the plurality of logic components is a current logic component for the rule applied to that logic component.

28. The apparatus of claim 25, wherein the logic components include model instances defining specific instances of a component and model definitions defining functionality of the respective model instances, and wherein the means for establishing includes means for establishing a pointer from a model instance to a model definition defining functionality of the model instance.

29. The process of claim 25, wherein the means for establishing includes means for establishing a pointer from a port instance component to a port definition component functionally defining the interface of the input component of the model instance.

30. The process of claim 25, wherein the establishing step includes the step of establishing a pointer from a port instance component to a port definition component functionally defining the interface of the output component of the model instance.

31. A process for automatic design of a logic circuit by a data processing system which yields a data structure representing interconnected logic components, said data structure being stored in a data base in a memory of the data processing system, the process being performed by the data processing system and comprising the steps, performed by the data processing system, of:

inputting into locations of the data base in the memory, by the data processing system, data representing a plurality of logic components, the logic components corresponding to components of a logic circuit and belonging to different levels of a data hierarchy;

inputting, by the data processing system, a plurality of logic component definitions to the data base, the logic component definitions representing functional characteristics of the logic components;

inputting, by the data processing system, a plurality of rules to the data base, the rules belonging to different levels of a rule hierarchy, and the levels of the rule hierarchy including a first level of rules which are each applicable to at least one of the plurality of logic components, a second level of rules which are each applicable to at least one of the plurality of logic component definitions, and a third level of rules which are each applicable to all of the logic components;

establishing, by the data processing system, bidirectional pointers between the locations in the data base containing the data for the plurality of logic components, the pointers being determined according to the logic circuit, wherein the pointers allow the location containing data for any logic component in the data base to be accessed by following pointers from the location containing data for any other logic component in the data base;

searching, by the data processing system, through the plurality of rules stored in the data base in order to select one of the plurality of rules to be applied to a first one of the plurality of logic components, the first level of rules being searched first, the second level of rules being searched when the search of the first level reveals that none of the rules of the first level are applicable to the first logic component, and the third level being searched when the search of the second level reveals that none of the rules of the second level are applicable to the first logic component; and altering, by the data processing system, a subset of the data for the logic components in the data base by application of the selected rule to the first logic component, the altering of the subset resulting in a formation in the data base in the memory of a new data structure representing a logic circuit including a plurality of interconnected logic components.

32. The method according to claim 31, wherein each of the plurality of rules has an antecedent portion and a consequence portion, the method further comprising the steps of:

determining, for the first logic component, whether an antecedent portion of a first one of the plurality of rules in one of the plurality of hierarchy levels associated with the first logic component is true or is false;

when the antecedent portion of the first rule is false, thereafter performing the determining step on at least a second one of the plurality of rules in the hierarchy level associated with the first logic component; and when the antecedent portion of the first rule is true, thereafter performing the consequence portion of the first rule.

33. A data processing apparatus for automatic design of a logic circuit represented by a data structure containing interconnected logic components, the data processing apparatus comprising:

a memory;

means for inputting into locations in the memory of the data processing apparatus data representing a plurality of logic components of the logic design to be synthesized, the logic components belonging to different levels of a data hierarchy;

means for inputting a plurality of logic component definitions to the memory, the logic component definitions representing functional characteristics of the logic components;

means for inputting a plurality of rules to the memory, the rules belonging to different levels of a rule hierarchy, and the levels of the rule hierarchy including a first level of rules which are each applicable to at least one of the plurality of logic components, a second level of rules which are each applicable to at least one of the plurality of logic component definitions, and a third level of rules which are each applicable to all of the logic components;

means for establishing bidirectional pointers between the locations in the memory containing the data for the plurality of logic components, the pointers being determined according to the logic circuit to be synthesized, wherein the pointers allow the location containing data for any logic component in the memory to be accessed by following pointers from the location containing data for any other logic component in the memory;

means for searching through the plurality of rules stored in the memory in order to select one of the plurality of rules to be applied to a first one of the plurality of logic components, the first level of rules being searched first, the second level of rules being searched when the search of the first level reveals that none of the rules of the first level are applicable to the first logic component, and the third level being searched when the search of the second level reveals that none of the rules of the second level are applicable to the first logic component; and means for altering a subset of the data for the logic components in the memory by application of the selected rule to the first logic component, the altering of the subset resulting in a formation in the memory of a new data structure representing a new logic circuit design including a plurality of interconnected logic components.

* * * * *